(12) United States Patent
Stewart (10) Patent No.: US 10,295,421 B2
(45) Date of Patent: May 21, 2019

(54) MICRO MECHANICAL DEVICES WITH AN IMPROVED RECESS OR CAVITY STRUCTURE

(71) Applicant: Honeywell International Inc., Morris Plains, NJ (US)

(72) Inventor: Carl Stewart, Plano, TX (US)

(73) Assignee: HONEYWELL INTERNATIONAL INC., A DELAWARE CORPORATION, Morristown, NJ (US)

( * ) Notice: Subject to any disclaimer, the term of this patent is extended or adjusted under 35 U.S.C. 154(b) by 0 days.

(21) Appl. No.: 15/547,585

(22) PCT Filed: Feb. 12, 2015

(86) PCT No.: PCT/US2015/015542
§ 371 (c)(1),
(2) Date: Jul. 31, 2017

(87) PCT Pub. No.: WO2016/130123
PCT Pub. Date: Aug. 18, 2016

(65) Prior Publication Data
US 2018/0024021 A1    Jan. 25, 2018

(51) Int. Cl.
*G01L 9/00* (2006.01)
*B81B 3/00* (2006.01)
*B81C 1/00* (2006.01)

(52) U.S. Cl.
CPC ............ *G01L 9/0054* (2013.01); *B81B 3/007* (2013.01); *B81C 1/00158* (2013.01);
(Continued)

(58) Field of Classification Search
CPC ... G01L 9/0042; G01L 9/0045; G01L 9/0054; G01L 9/0055; B81B 2201/0264;
(Continued)

(56) References Cited

U.S. PATENT DOCUMENTS 5,165,289 A * 11/1992 Tilmans .................. G01L 1/183
73/702
2002/0083775 A1 * 7/2002 Haji-Sheikh .......... G01L 9/0042
73/715
(Continued)

FOREIGN PATENT DOCUMENTS

CN    101988859 A    3/2011
CN    103575431 A    2/2014
(Continued)

OTHER PUBLICATIONS

PCT Application No. PCT/US2015/015542, International Search Report, dated Nov. 4, 2015, 3 pages.
(Continued)

*Primary Examiner* — Francis C Gray
(74) *Attorney, Agent, or Firm* — Alston & Bird LLP (57) ABSTRACT

A sensor includes a first substrate and a second substrate. The first substrate includes a first side and an opposing second side, with the first side having a recess. The recess is defined by one or more side walls and a bottom wall. One or more of the side walls are substantially perpendicular to the bottom wall. A sensing diaphragm is defined between the second side of the first substrate and the bottom wall of the recess. A boss extends from the bottom wall of the recess. The second substrate may include a first side and an opposing second side, where the first side has a recess. The first side of the first substrate may be secured to the first side of the second substrate such that the recess in the first substrate faces and is in fluid communication with the recess in the second substrate.

18 Claims, 9 Drawing Sheets

(52) U.S. Cl.
CPC .......... *G01L 9/0042* (2013.01); *G01L 9/0045* (2013.01); *G01L 9/0055* (2013.01); *B81B 2201/0264* (2013.01); *B81B 2203/0127* (2013.01); *B81B 2203/0315* (2013.01)

(58) Field of Classification Search
CPC .... B81B 2203/0127; B81B 2203/0315; B81B 3/007; B81C 1/00158
See application file for complete search history.

(56) References Cited

U.S. PATENT DOCUMENTS

| | | | |
|---|---|---|---|
| 2005/0016288 A1* | 1/2005 | Muchow | B81C 1/00158 73/754 |
| 2012/0297884 A1* | 11/2012 | Gamage | G01L 9/0047 73/717 |
| 2013/0087864 A1* | 4/2013 | Ten Have | B81C 1/00158 257/419 |
| 2015/0192486 A1* | 7/2015 | Stewart | B81C 1/00158 257/415 |

FOREIGN PATENT DOCUMENTS

| | | |
|---|---|---|
| CN | 107209077 A | 9/2017 |
| EP | 2527810 A2 | 11/2012 |
| EP | 3256831 A | 12/2017 |
| WO | 2016130123 A1 | 8/2016 |

OTHER PUBLICATIONS

PCT Application No. PCT/US2015/015542, Written Opinion of the International Searching Authority, dated Nov. 4, 2015, 7 pages.
PCT Application No. PCT/US2015/015542, International Preliminary Report on Patentability, dated Aug. 15, 2017, 8 pages.
Europe Application No. 15706350.4, Communication pursuant to Rules 161(1) and 162 EPC, dated Sep. 19, 2017, 2 pages.
Office Action for Chinese Application No. 201580075995.0 dated Mar. 22, 2019, 11 pages.

* cited by examiner

MICRO MECHANICAL DEVICES WITH AN IMPROVED RECESS OR CAVITY STRUCTURE

CROSS REFERENCE TO RELATED APPLICATION

This application claims priority to International Application No. PCT/US2015/015542 (entitled MICRO MECHANICAL DEVICES WITH AN IMPROVED RECESS OR CAVITY STRUCTURE filed Feb. 12, 2015), which is incorporated herein by reference.

TECHNICAL FIELD

The present disclosure relates generally to Micro-Electro-Mechanical Systems (MEMS), and more particularly, to Micro-Electro-Mechanical Systems with an improved recess or cavity structure.

BACKGROUND

Micro-Electro-Mechanical Systems (MEMS) are used in a wide variety of applications including, for example, commercial, automotive, aerospace, industrial, and medical application. Micro-Electro-Mechanical Systems (MEMS) can include miniaturized mechanical and electro-mechanical elements (i.e., devices and structures) that are made using microfabrication techniques. MEMS systems can include a wide variety of devices and/or systems including microsensors and microactuators.

An example MEMS microsensor is a pressure sensor. Pressure sensors are often formed by anisotropically etching a recess into a back side of a silicon substrate die, leaving a thin flexible diaphragm. In operation, at least one surface of the diaphragm is exposed to an input pressure. The diaphragm deflects according to the magnitude of the input pressure, and this deflection creates a change in the resistance of the piezoresistors. The change in resistance of the piezoresistors is reflected as a change in an output voltage signal from a resistive bridge formed at least in part by the piezoresistors. In some cases, the diaphragm may be made thinner with the addition of support bosses, which may help increase the sensitivity of the diaphragm over a flat plate diaphragm.

The cost of a MEMS die is often directly related to die size. The die size of MEMs devices that have a recess or cavity, such as pressure sensors or other MEMS devices, is often driven by the structure of the recess or cavity. What would be desirable is a MEMS device with an improved recess or cavity structure that helps reduce die size while still achieving good device performance.

SUMMARY

The present disclosure relates generally to Micro-Electro-Mechanical Systems (MEMS), and more particularly, to Micro-Electro-Mechanical Systems with an improved recess or cavity structure.

An example MEMS device is a pressure sensor. While a pressure sensor is used for illustrative purposes herein, it is contemplated that the present disclosure is applicable to any suitable MEMS device as desired. The illustrative pressure sensor may include a first substrate and a second substrate. The first substrate may have a first side and an opposing second side. The first side may have a recess. The recess may be defined by one or more side walls and a bottom wall, wherein the one or more side walls are substantially perpendicular to the bottom wall. A sensing diaphragm may be defined between the second side of the first substrate and the bottom wall of the recess. In some cases, a boss may extend from the bottom wall of the recess and into the recess. The boss may be defined by side walls, wherein the side walls of the boss may be substantially perpendicular to the bottom wall of the recess. The second substrate may include a first side and an opposing second side. The first side may have a recess. The first side of the first substrate may be secured to the first side of the second substrate such that the recess in the first substrate faces and is in fluid communication with the recess in the second substrate, forming a pressure sensor device.

In another example, a sensor may include a sensor body having a first side and a second side. A sealed buried cavity may be situated between the first side and the second side of the sensor body, with a sensing diaphragm between the sealed buried cavity and the first side of the sensor body. The extent of the buried cavity may be defined by one or more side walls, a top wall toward the first side of the sensor body and a bottom wall toward the second side of the sensor body. In some cases, a boss may extend from the sensing diaphragm and into the buried cavity, but not all the way to the other side of the buried cavity. The boss may extend laterally along the sensing diaphragm and may intersect one or more of the side walls of the buried cavity at one, two, three, four, five or more discrete locations. In some cases, the boss may be defined by side walls, wherein the side walls of the boss are substantially perpendicular to the top wall of the buried cavity.

An example method of forming a sensor may include etching a recess in an epitaxial layer of a silicon-on-insulator (SOI) substrate. The SOI wafer may include a substrate layer and the epitaxial layer, with an oxide layer between the substrate layer and the epitaxial layer. The etched recess may define an extent of a sensing diaphragm and a boss for the sensing diaphragm. The method may further include etching a recess into a second substrate and securing the silicon-on-insulator (SOI) substrate to the second substrate, such that the recess in the epitaxial layer of a silicon-on-insulator (SOI) substrate faces and is in fluid communication with the recess in the second substrate. The method may further include removing the substrate layer of the silicon-on-insulator (SOI) substrate.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and the drawing, which is not necessarily to scale, depicts an illustrative embodiment and is not intended to limit the scope of the disclosure. The illustrative embodiment depicted is intended only as exemplary.

As used herein, the term "fluid" is not intended to be limited to a liquid. Rather, the term "fluid" is intended to include any material subject to flow such as, but not limited to, liquids and/or gases.

Figure 1:
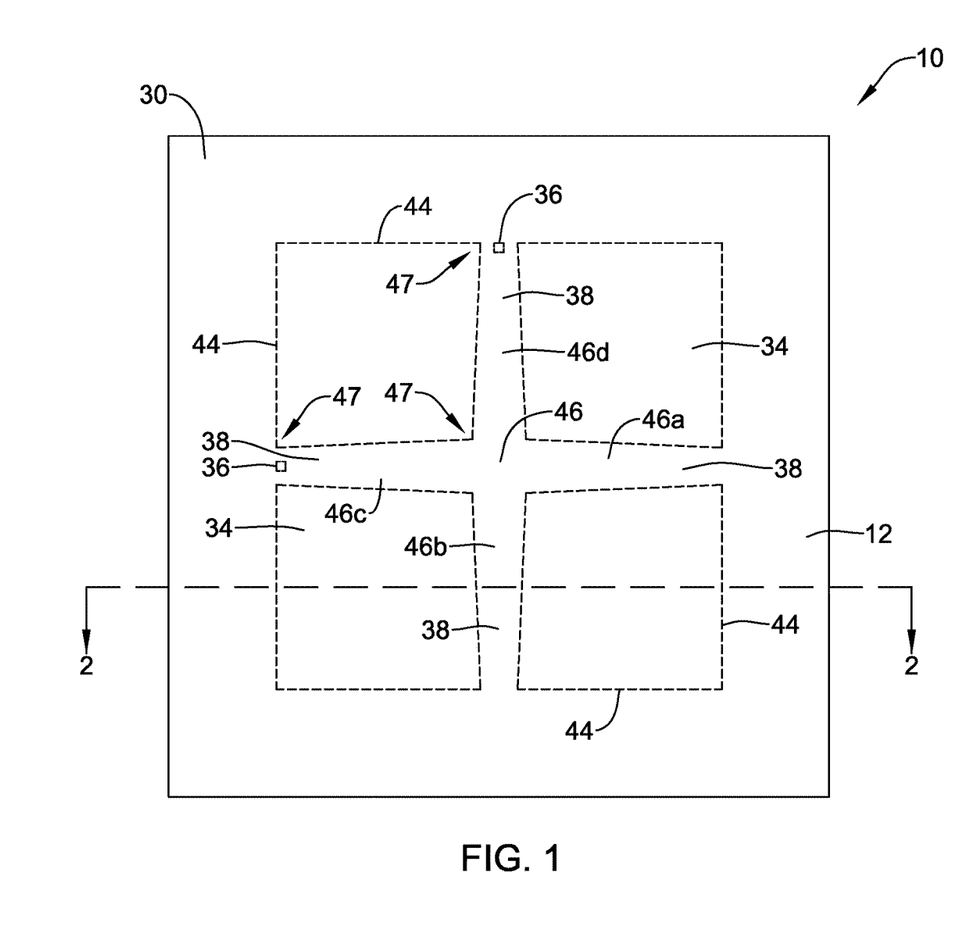
FIG. 1 is a top view of a pressure sensor having an illustrative bossed diaphragm design.
Figure 2:
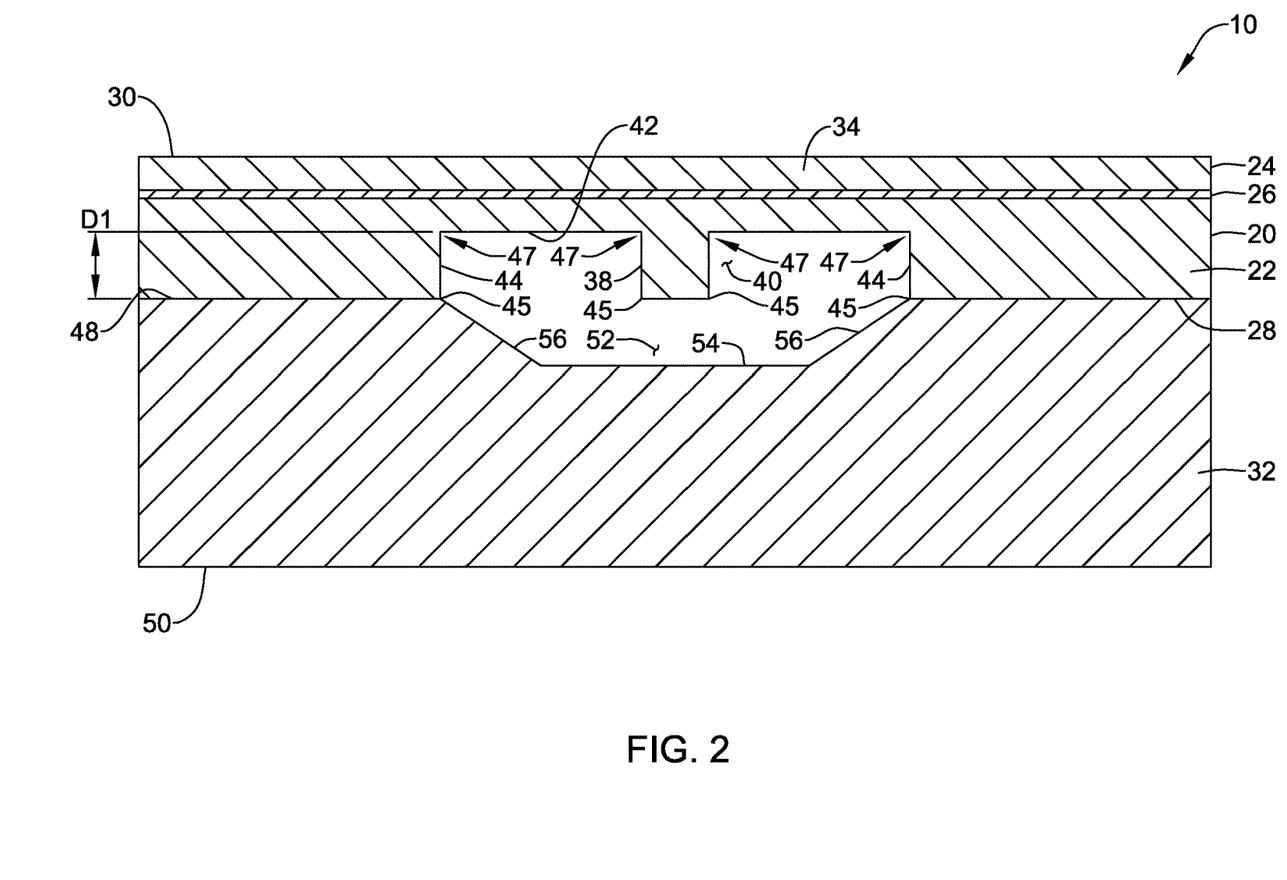
FIG. 2 is a cross-sectional view of the pressure sensor shown in FIG. 1, taken at line 2-2.

FIG. 1 is a top view of a pressure sensor 10 having an illustrative bossed diaphragm design. FIG. 2 illustrates a cross-section of the pressure sensor 10 taken at line 2-2 in FIG. 1. The pressure sensor 10 may include a first substrate 20 and a second substrate 32. In some instances, the first substrate 20 may be a layered silicon-insulator-silicon substrate or wafer formed with silicon on insulator (SOI) technology, although this is not required. It is contemplated that other substrates may be used, as desired. The first substrate 20 may include a first silicon layer 22 facing a first side 28 of the first substrate 20, and a second silicon layer 24 facing a second side 30, opposite the first side 28, of the first substrate 20. An insulating, or oxide, layer 26 may be disposed between the first silicon layer 22 and the second silicon layer 24. In some instances, the insulating layer 26 may be formed from silicon dioxide, silicon nitride, sapphire, and/or any other suitable insulating material. While the second silicon layer 24 is illustrated in FIG. 2, in some instances, the second silicon layer 24 may be thinned or removed such that the oxide layer 26 is exposed at the second side 30. Alternatively, and in some cases, the second silicon layer 24 and oxide layer 26 are not provided from the start.

The second substrate 32 may be any semi-conductor wafer (e.g. silicon or germanium) or other substrate as desired. It is contemplated that either or both the first substrate 20 or the second substrate 32 may be doped with an impurity to provide an n-type or p-type extrinsic semi-conductor. For example, the first substrate 20 may be an n-type substrate while the second substrate 32 may be a p-type substrate. The reverse configuration is also contemplated, or both substrates may be doped the same polarity. In some instances, the first substrate 20 and/or the second substrate 32 may include an epitaxial layer.

A portion of the first substrate 20, such as a portion of the first silicon layer 22, may be removed, leaving a thin, flexible diaphragm 34 over a cavity or recess 40. The diaphragm 34 may be positioned between a bottom wall 42 of the recess 40 and the second side 30 of the first substrate 20. In some cases, piezoresistors 36 may be located in or on the diaphragm 34 to measure deflection/stress of the diaphragm 34 to form a pressure sensor. During operation, at least one surface of the diaphragm 34 may be exposed to an input pressure. The diaphragm 34 may then deflect according to a magnitude of the pressure on the diaphragm 34. A deflection of the diaphragm 34 then creates changes in resistance in the piezoresistors 36. A change in resistance of the piezoresistors 36 may be reflected as a change in an output voltage signal of a resistive bridge that is formed at least partially by the piezoresistors 36. The output voltage provides a measure of the input pressure exerted on the diaphragm 34.

The recess 40 may include a bottom wall 42 and one or more side walls 44. The terms bottom, top, and side are used herein as relative terms to indicate relative position of the various components. In some instances, the recess 40 may have a generally square shape defining four side walls 44. However, it is contemplated that the recess 40 may be any shape desired. In some embodiments, the a majority of the length of the side walls 44 may be perpendicular to, or substantially perpendicular to, a majority of the length of the bottom wall 42 of the recess 40. However, this is not required. In some instances, one or more of the side walls 44 may extend at a non-orthogonal angle from the bottom wall 42. The side walls 44 of the recess 40 may define a lateral extent and depth D1 of the recess 40.

While the boss 38 is illustrated as having generally squared or angular corners and edges 45, it is contemplated that the corners and edges 45 may be rounded or curved. In some instances, the edges round a perimeter of the diaphragm 34 and/or boss 38 may also have curved or rounded edges and corners 47. Rounded edges and corners 45, 47 may substantially increase the burst pressure of diaphragm 34 by reducing sharp edges of boss 38. Such a structure is disclosed in commonly assigned U.S. patent application Ser. No. 14/543,074 entitled "Pressure Sensor Having a Bossed Diaphragm" which is herein incorporated by reference.

The illustrative sensor 10 may further include one or more bosses 38 extending from the bottom wall 42 and into the recess 40. For example, and as shown in FIG. 1, one or more bosses 38 may extend laterally across the recess 40. When so provided, the side walls 44 of the recess 40 may intersect one or more side walls of one or more bosses 38. In some instances, one or more of the bosses 38 may extend across the entire lateral extent and depth D1 of the recess 40, while in other instances, the bosses 38 may extend only extend partially across the lateral extent and/or depth D1 of the recess 40.

It is contemplated that the one or more bosses 38 may be formed in a pattern. In some cases, the pattern may be selected to achieve a desired sensitivity and linearity across a desired input pressure of a pressure sensor. In some instances, the pattern may be relatively simple, such as the "X" or cross shape pattern, such as that shown in FIG. 1. In other instances, the pattern may be more intricate. A bossed diaphragm with a cross pattern may provide 50 percent to 100 percent more sensitivity than a flat plate diaphragm of the same diaphragm area. Said another way, a device that has a bossed diaphragm may be made smaller than a device that has a flat plate diaphragm while providing the same level of sensitivity. In some embodiments, the bosses 38 may extend between the one or more side walls 44 of the recess 40. In some cases, the bosses 38 may extend to the side walls 44 at one, two, three, four, or more discrete locations. As shown in FIG. 1, the "X" shaped boss 38 may extend to four discrete locations, and may have a center 46 at a center of the diaphragm 34. Each of the four boss legs 46a, 46b, 46c, 46d (collectively 46) may extend from the center 46 in different directions towards the side walls 44 of the recess 40. In some cases, a boss pattern may be used in which none, or less than all, of the patterned legs extends laterally to the side walls 44.

Referring to FIG. 2, the second substrate 32 may have a first side 48 and a second side 50 generally opposite the first side 48. A recess 52 may be formed in the first side 48 of the second substrate 32. The recess 52 may include a bottom wall 54 and one or more side walls 56. In the example shown, the recess 52 may have a generally square shape defining four side walls 56. However, it is contemplated that the recess 52 may have any desired shape. In some instances, the shape of the recess 52 may have an outer profile or perimeter that is similar to the outer profile or perimeter of the recess 40 in the first substrate 20. In some embodiments, the side walls 56 may be perpendicular to, or substantially perpendicular to, the bottom wall 54 of the recess 52. However, this is not required. As shown in FIG. 2, the side walls 56 may extend at a non-orthogonal angle from the bottom wall 54. While not explicitly shown in FIG. 2, and in some cases, the second substrate 32 may include a port extending from the second side 50 into the recess 52. In other cases, the recess 52 does not include such a port. The first side 28 of the first substrate 20 may be secured to the first side 48 of the second substrate 32 such that the recess 40 in the first substrate 28 faces and is in fluid communication with the recess 52 in the second substrate 32.

FIG. 3A-F show an illustrative method for forming a pressure sensor 100. While the method is described relative to a single device or sensor 100, it is contemplated that a plurality of devices may be made on a single wafer and subsequently cut or separated into individual devices. Moreover, while the method is described relative to a pressure sensor, it is contemplated that the techniques may be applied to any other suitable micro-electro-mechanical system (MEMS) device as desired.

Figure 3A:
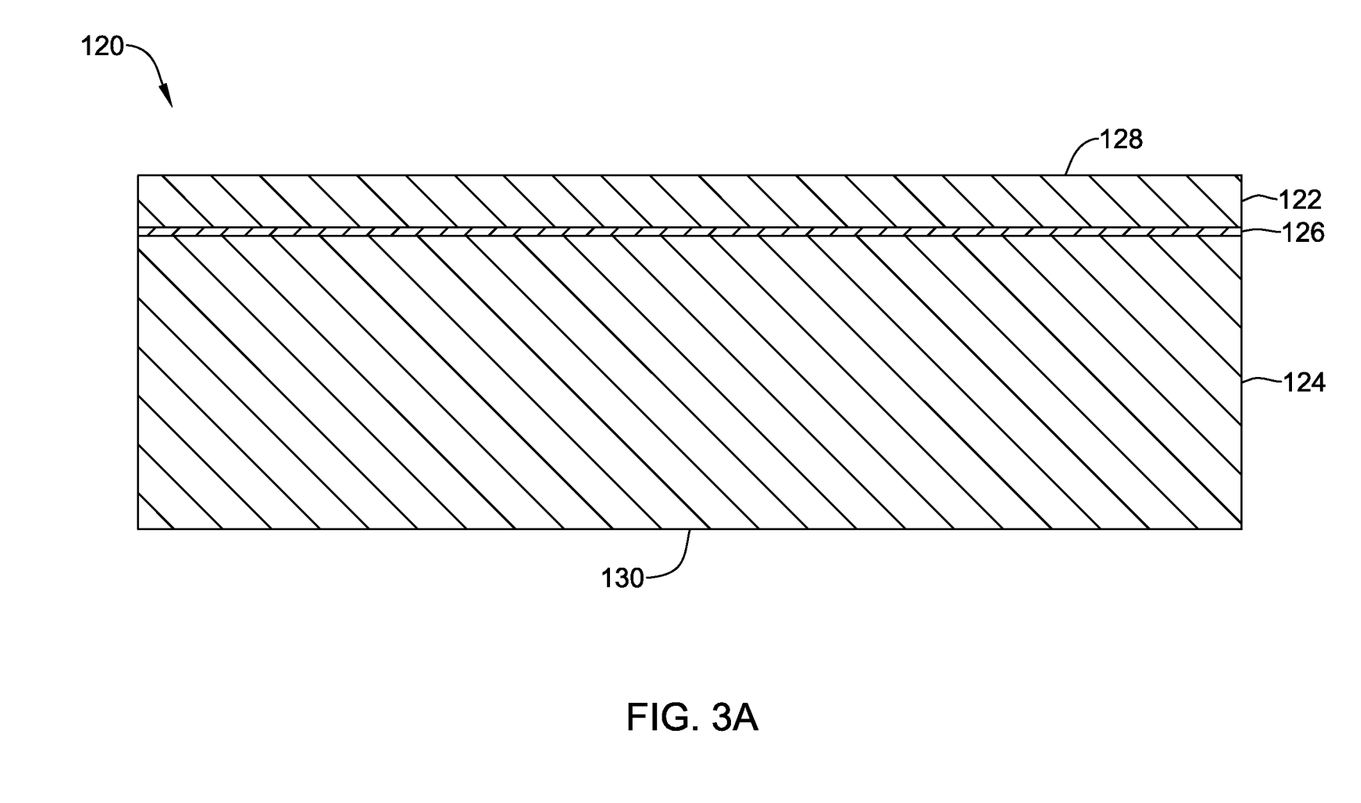
FIG. 3A-F show an illustrative method for forming a pressure sensor.

Referring specifically to FIG. 3A, a first substrate 120 may be provided. In some cases, the first substrate 120 may be a layered silicon-insulator-silicon substrate or wafer formed with silicon on insulator (SOI) technology. However, it is contemplated that other substrates may be used, as desired. In the example shown, the first substrate 120 may include a first silicon (or substrate) layer 122 adjacent a first or top side 128 of the first substrate 120 and a second silicon (or substrate) layer 124 adjacent to a second or bottom side 130, opposite the first side 128, of the first substrate 120. An insulating, or oxide, layer 126 may be disposed between the first silicon layer 122 and the second silicon layer 124. In some instances, the insulating layer 126 may be formed from silicon dioxide, silicon nitride, sapphire, and/or any other suitable insulating material. In some instances, the first silicon layer 122 may be an epitaxial layer, but this is not required.

Figure 3B:
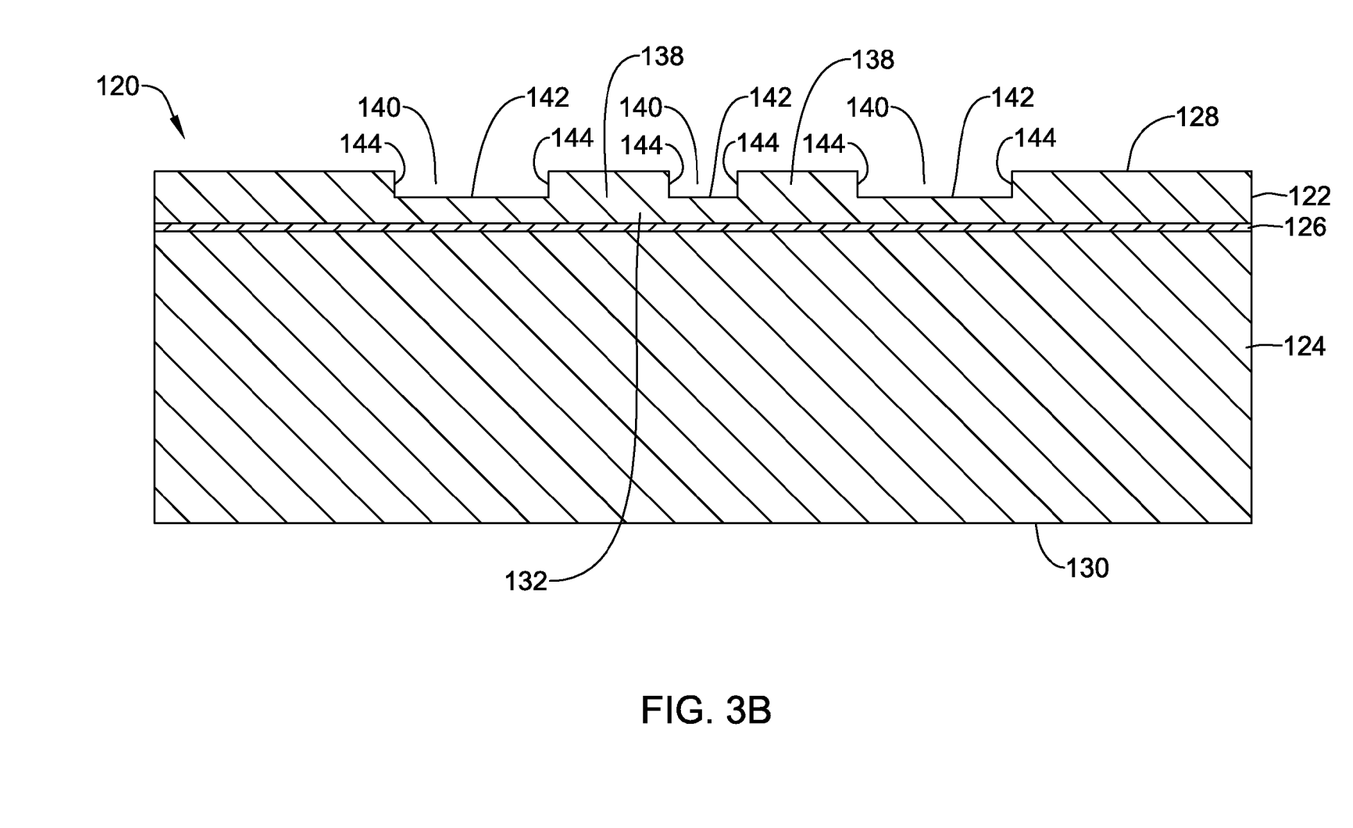

Referring now to FIG. 3B, a portion of the first substrate 120, such as a portion of the first silicon layer 122, may be removed or etched to define one or more recesses 140 and one or more bosses 138 in the top side 128 of the substrate 120. In some instances, the recess 140 may be one recess with one or more bosses 138 extending up from a bottom of the recess and into the recess. In some cases, the bosses 138 may extend between and contact an outer perimeter or outer side wall of the recess 140, as shown in FIG. 1. However, some or none of the bosses 138 may contact the outer side wall of the recess or recesses 140.

It is contemplated that the one or more bosses 138 may be formed in a pattern. The pattern may be selected to achieve a desired sensitivity and/or linearity across a desired input pressure of a pressure sensor. In some instances, the pattern may be relatively simple, such as the "X" or cross shape pattern as illustrated in FIG. 1. In other instances, the pattern may be more intricate. The region adjacent to the one or more recesses 140 may form a diaphragm.

It is contemplated deep reactive-ion etching (DRIE) may be used to create the recess 140 and/or pattern of bosses 138. Deep reactive-ion etching (DRIE) may provide side walls 144 that are perpendicular to the bottom wall 142. The depth of the recess 140 may be controlled by controlling the duration of the etch process, the use of an etch stop layer, and/or in any other suitable manner. In some instances, the bottom wall 142 of the recess 140 may be spaced a distance from the oxide layer 126, while in other cases the bottom wall 142 of the recess 140 may abut the oxide layer 126. In some cases, the oxide layer 126 may act as an etch stop for the etch process, such that the oxide layer 126 forms the bottom wall 142 of the recess 140.

The recess 140 may include a bottom wall 142 and one or more side walls 144. The recess 140 may be any shape desired. In some embodiments, the side walls 144 may be perpendicular to, or substantially perpendicular to, the bottom wall 142 of the recess 140. However, this is not required. It is contemplated that the side walls 144 may extend at a non-orthogonal angle from the bottom wall 142. The side walls 144 of the recess 140 may define a lateral extent of the recess 140. The bosses 138 may extend laterally across the recess 140. In some embodiments, the bosses 138 may extend across the entire lateral extent of the recess 140 while in other instances the bosses 138 may extend only partially across the lateral extent of the recess 140. Vertical or substantially vertical side walls 144 of the recess may decrease the size of the device while maintaining a desired level of sensitivity.

Figure 3C:
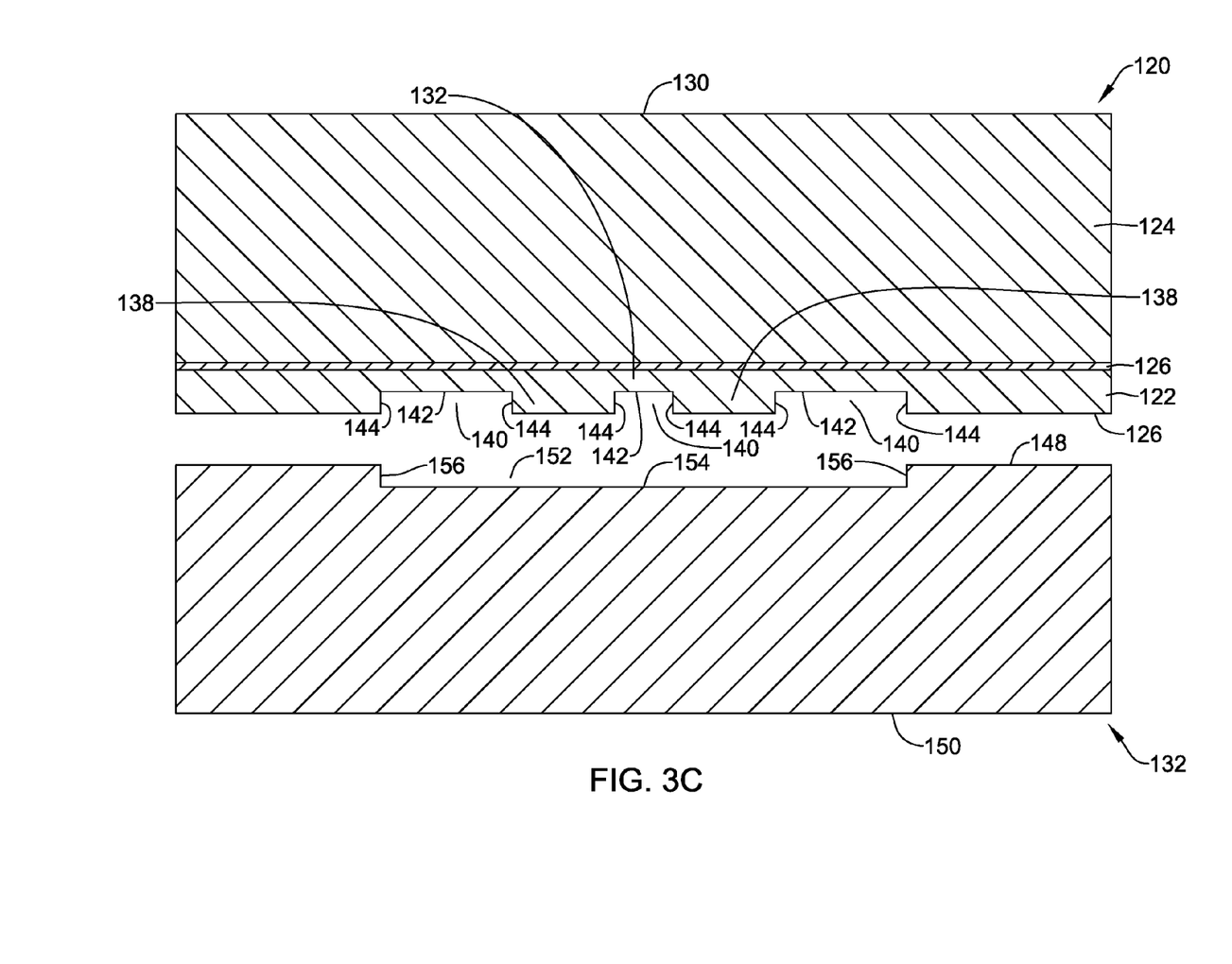

Referring now to FIG. 3C, a second substrate 132 may be provided. The second substrate 132 may be any semiconductor wafer (e.g. silicon or germanium) or other substrate as desired. The second substrate 132 may include a first side 148 and a second side 150 generally opposite the first side 148. A recess 152 may be formed in the first side 148 of the second substrate 132. The recess 152 may be formed in any suitable manner, such as but not limited to DRIE etching and/or KOH etching. The recess 152 in the second substrate 132 may include a bottom wall 154 and one or more side walls 156. In the example shown, the recess 152 may have a generally square shape defining four side walls 156. However, it is contemplated that the recess 152 may be any shape desired. In some instances, the shape of the recess 152 may have an outer profile or perimeter that is similar to an outer profile or perimeter of the recess 140 in the first substrate 120, such that the recesses 140, 152 can be aligned to form a cavity. In some instances, the side walls 156 of recess 152 may be perpendicular to, or substantially perpendicular to, the bottom wall 154 of the recess 152. However, this is not required. In some cases, the side walls 156 may extend at a non-orthogonal angle from the bottom wall 154, such as shown in FIG. 2.

Figure 3D:
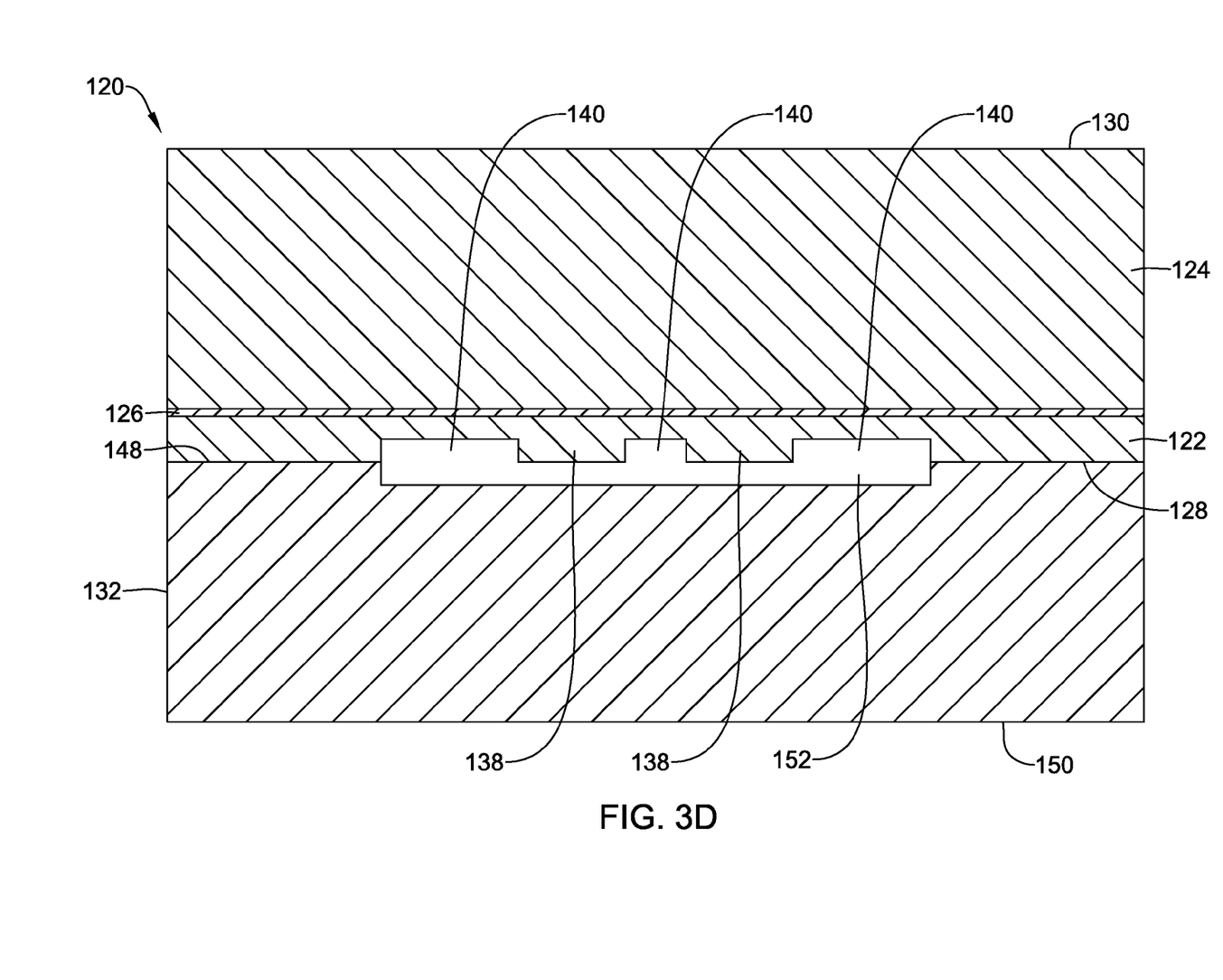

As shown in FIG. 3D, the first side 128 of the first substrate 120 may be bonded to the first side 148 of the second substrate 132, such that the recess 140 in the first substrate 120 is aligned, or in registration with, and in fluid communication with, the recess 152 in the second substrate 132. The composite device 120/132 may form a sensor body that has a sealed buried cavity 140/152 (see FIG. 3D-3E) or a ported buried cavity 140/162 (see FIG. 3F). For clarity, some reference numbers have been omitted from FIGS. 3D-3F.

Figure 3E:
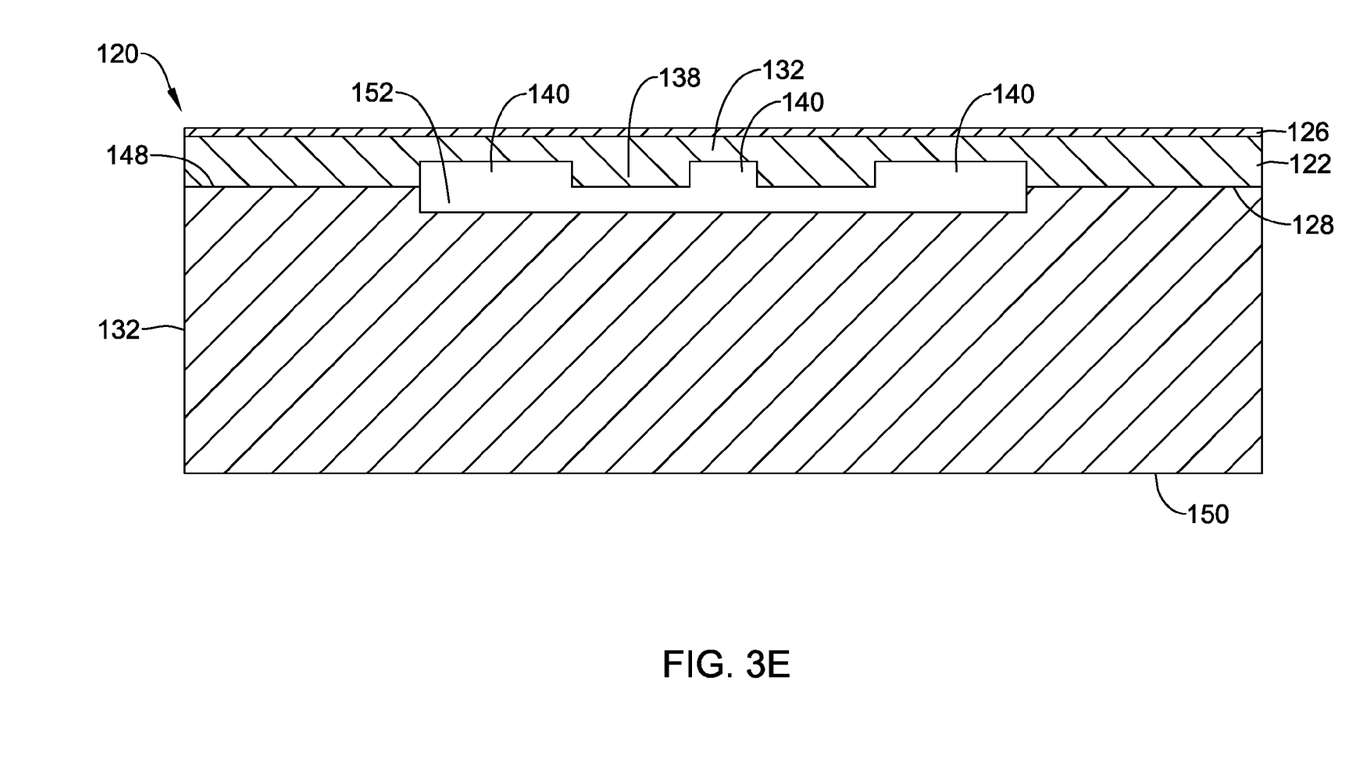
Figure 3F:
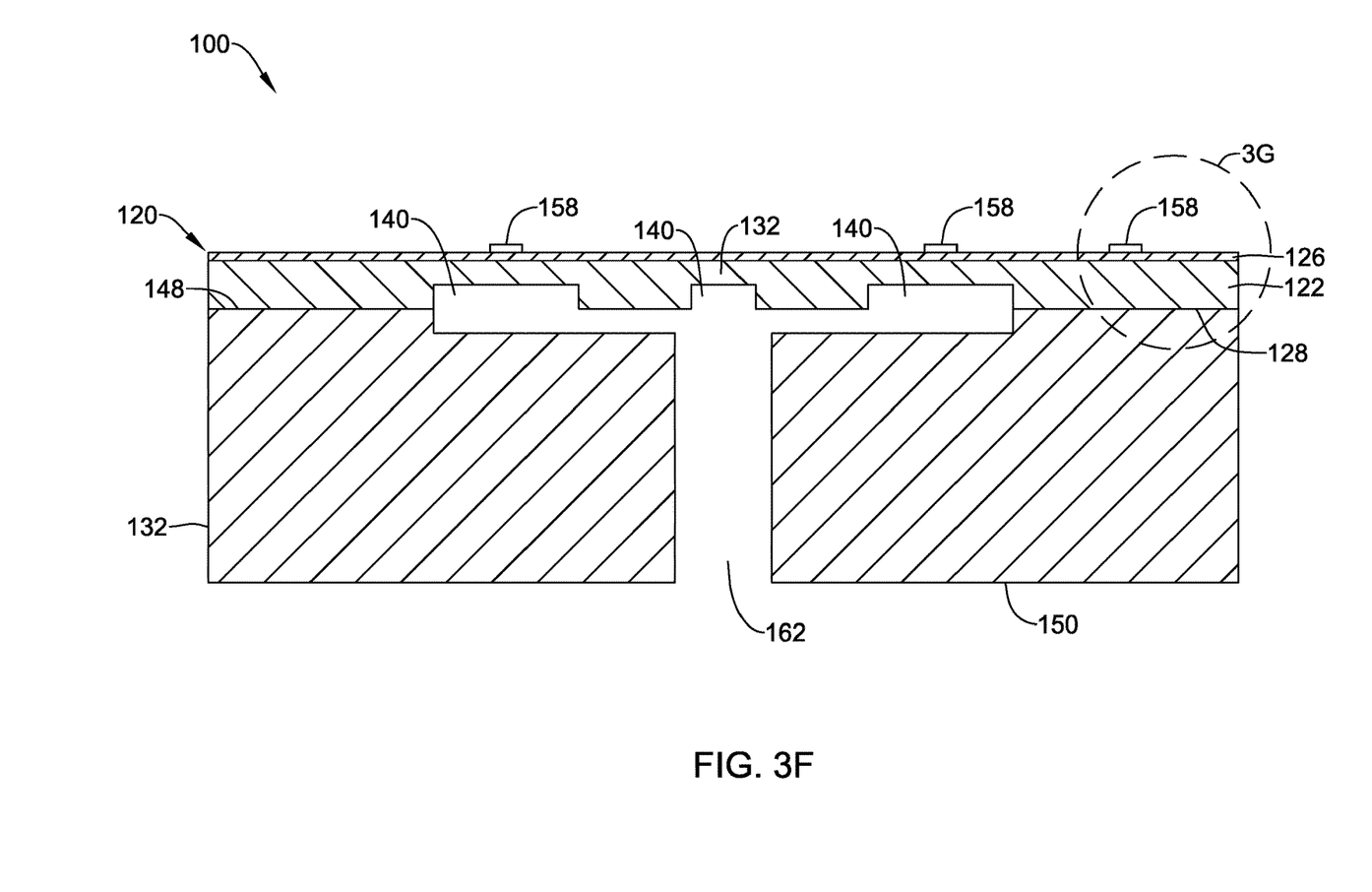
Figure 3G:
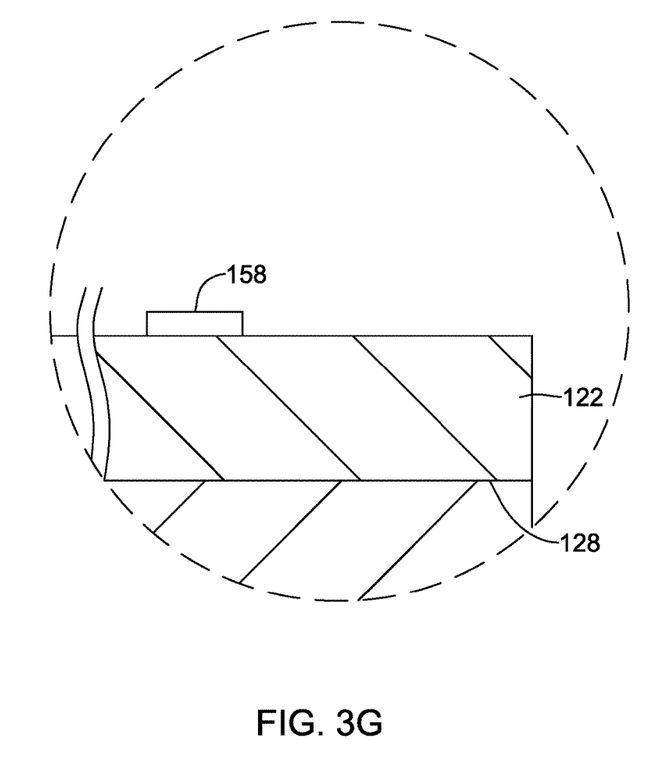
FIG. 3G shows an alternative construction of the portion of the pressure sensor labeled 3G in FIG. 3F.

As shown in FIG. 3E, the second silicon layer 124 may be thinned or removed completely to leave a thin, flexible diaphragm 134. The second silicon layer 124 may be removed in a controlled manner to arrive at a diaphragm 134 having a desired thickness. In some instances, the oxide layer 126, or, if present, the second silicon layer 124, may be further processed, such as through etching and/or chemical-mechanical planarization (CMP), to prepare the surface for electrical circuits and/or components. Electrical components 158 may be formed on the oxide layer 126, as shown in FIG. 3F. In some instances, such as shown in FIG. 3G, the oxide layer 126 of FIG. 3F may be removed, and circuit elements such as transistors, diodes, resistors, traces, and/or other integrated circuit components may be formed in and/or on the first silicon layer 122 using conventional integrated circuit processing techniques. The circuit elements may be connected so sensor elements 158 to provide some level of signal processing before providing an output signal to bond pads 160 of the pressure sensor. The signal processing may filter, amplify, linearize, calibrate and/or otherwise process the raw sensor signal produced by the sensor elements (e.g. piezoresistors 36).

During use, the diaphragm 134 may be stressed and/or deform in response to an applied pressure by a sensed media. This stress and/or deformation can be detected by one or more electrical components or sense elements 158 (e.g. piezoresistors) on or embedded within the sensing diaphragm 134. Output signals that are indicative of the applied pressure may be provided via the one or more bond pads 160. In some instances, a port 162 may be provided through the second substrate 132 to the cavity/recesses 140, 152 to allow for sensing of media from a backside of the device 100, but this is not required.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A sensor, comprising:
    a first substrate comprising:
        a first side and an opposing second side, the first side having a recess;
        the recess defined by one or more side walls and a bottom wall, wherein the one or more side walls are substantially perpendicular to the bottom wall;
        a sensing diaphragm defined between the second side of the first substrate and the bottom wall of the recess;
        a boss extending from the bottom wall of the recess and into the recess, the boss defined by side walls, wherein the side walls of the boss are substantially perpendicular to the bottom wall of the recess, and wherein the one or more side walls of the recess of the first substrate define a lateral extent of the recess of the first substrate, wherein the boss extends laterally across the recess of the first substrate;
    a second substrate comprising:
        a first side and an opposing second side;
        the first side having a recess;
    wherein the first side of the first substrate is secured to the first side of the second substrate such that the recess in the first substrate faces and is in fluid communication with the recess in the second substrate;
    wherein the sensing diaphragm is positioned above the boss, wherein an oxide layer is positioned between the sensing diaphragm and the boss; and
    wherein the boss extends to the side walls of the recess of the first substrate at three or more discrete locations.

2. The sensor of claim 1, wherein the recess in the second substrate is in registration with the recess in the first substrate.

3. The sensor of claim 1, wherein the recess in the second substrate is defined by one or more side walls and a bottom wall, and wherein the one or more side walls are substantially perpendicular to the bottom wall of the recess in the second substrate.

4. The sensor of claim 1, wherein the boss is patterned to comprise an "X" shape, with a center of the "X" shape at a center of the sensing diaphragm.

5. A sensor, comprising:
    a sensor body having a first side and a second side;
    a sealed cavity situated between the first side and the second side of the sensor body, with a sensing diaphragm between the sealed cavity and the first side of the sensor body, the cavity defined by one or more side walls, a top wall adjacent to the first side of the sensor body and a bottom wall adjacent to the second side of the sensor body; and
    a boss, wherein the sensing diaphragm is positioned above the boss, wherein an oxide layer is positioned between the sensing diaphragm and the boss, and wherein the boss extends to the side walls of the recess of the first substrate at three or more discrete locations.

6. The sensor of claim 5, wherein the boss extends laterally along the sensing diaphragm.

7. A method for making a sensor, comprising:
    etching a recess in a first layer of a silicon-on-insulator (SOI) substrate, wherein the SOI wafer includes the first layer and a second layer, the recess defining an extent of a sensing diaphragm and a boss for the sensing diaphragm, wherein the sensing diaphragm is positioned above the boss, wherein an oxide layer is positioned between the sensing diaphragm and the boss;
    etching a recess into a second substrate;
    securing the silicon-on-insulator (SOI) substrate to the second substrate, such that the recess in the first layer of the silicon-on-insulator (SOI) substrate faces and is in fluid communication with the recess in the second substrate;
    removing the second layer.

8. The method of claim 7, wherein removing the second layer comprises removing the second layer with an etch, wherein the oxide layer is an etch stop for the etch.

9. The method of claim 7, further comprising removing the oxide layer.

10. The method of claim 7, wherein removing the oxide layer comprises removing the oxide layer with an etch.

11. The method of claim 7, further comprising aligning the silicon-on-insulator (SOI) substrate with the second substrate such that the recess in the first layer is in registration with the recess in the second substrate.

12. The method of claim 7, wherein the recess in the first layer is defined by one or more side walls and a bottom wall, wherein the one or more side walls are substantially perpendicular to the bottom wall.

13. The method of claim 12, wherein the boss is defined by side walls, wherein the side walls of the boss are substantially perpendicular to the bottom wall of the recess.

14. The method of claim 7, wherein etching the recess in the first layer comprises etching the recess in the first layer with a Deep Reactive Ion Etch (DRIE).

15. The method of claim 12, wherein the one or more side walls of the recess in the first layer define a lateral extent of the recess, and wherein the boss extends laterally across the recess in the first layer.

16. The method of claim 15, wherein the boss extends to the side walls of the recess in the first layer.

17. The method of claim 15, wherein the boss is patterned to comprise an "X" shape, with a center of the "X" shape at a center of the sensing diaphragm.

18. The method of claim 7, further comprising forming one or more electrical components on a side of the first layer opposite the recess in the first layer.

* * * * *